US008175535B2

(12) United States Patent
Mu (10) Patent No.: US 8,175,535 B2
(45) Date of Patent: May 8, 2012

(54) ACTIVE CANCELLATION OF TRANSMITTER LEAKAGE IN A WIRELESS TRANSCEIVER

(75) Inventor: Fenghao Mu, Hjärup (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 1046 days.

(21) Appl. No.: 12/038,487

(22) Filed: Feb. 27, 2008

(65) Prior Publication Data

US 2009/0213770 A1    Aug. 27, 2009

(51) Int. Cl.
*H04B 1/00* (2006.01)
*H04B 17/00* (2006.01)
*H04B 1/10* (2006.01)

(52) U.S. Cl. ............... 455/67.11; 455/63.1; 455/67.13; 455/283; 455/296

(58) Field of Classification Search .......... 455/63.1, 455/67.11, 67.13, 295, 296, 283–285, 302–305, 455/114.2
See application file for complete search history.

(56) References Cited

U.S. PATENT DOCUMENTS

| | | | |
|---|---|---|---|
| 5,444,864 A | 8/1995 | Smith | |
| 6,311,045 B1 | 10/2001 | Domokos | |
| 6,507,728 B1 | 1/2003 | Watanabe et al. | |
| 6,516,183 B1 | 2/2003 | Hellmark | |
| 6,526,264 B2 | 2/2003 | Sugar et al. | |
| 6,717,980 B1 | 4/2004 | Rishi | |
| 6,745,018 B1 * | 6/2004 | Zehavi et al. | 455/296 |
| 7,043,208 B2 | 5/2006 | Nigra | |
| 7,058,368 B2 | 6/2006 | Nicholls et al. | |
| 7,123,591 B1 | 10/2006 | Ostertag et al. | |
| 7,123,676 B2 | 10/2006 | Gebara et al. | |
| 7,155,179 B1 | 12/2006 | Rothenberg | |
| 7,245,883 B2 | 7/2007 | Nakatani et al. | |
| 7,471,204 B2 * | 12/2008 | Safarian et al. | 340/572.1 |

(Continued)

FOREIGN PATENT DOCUMENTS

WO    00/21204 A1    4/2000

(Continued)

OTHER PUBLICATIONS

Schacherbauer et al., "An Interference Cancellation Technique for the Use in Multiband Software Radio Frontend Design," 30th European Microwave Conference Proceedings—Paris 2000, Oct. 3-5, 2000, pp. 341-344.

(Continued)

*Primary Examiner* — Simon Nguyen
(74) *Attorney, Agent, or Firm* — Coats & Bennett, P.L.L.C.

(57) ABSTRACT

Active transmitter leakage cancellation techniques are disclosed, for reducing transmitter leakage in a frequency-duplexing radio transceiver. Reducing transmitter leakage to the receiver path of a duplex transceiver eases the linearity requirements for low-noise amplifier and mixer circuits, potentially reducing transceiver cost as well as complexity. In an exemplary method, a radio-frequency (RF) cancellation signal is generated from a transmitter signal, and the RF cancellation signal is combined with a received RF signal to obtain a combined RF signal comprising a residual transmitter leakage component. The residual transmitter leakage component of the combined RF signal is converted, using, e.g., a frequency mixer, to obtain a down-converted signal at baseband or at an intermediate frequency. A magnitude of the residual transmitter leakage component is detected from the down-converted signal, and used to adjust the phase or amplitude of the RF cancellation signal, or both, to reduce the residual transmitter leakage component.

18 Claims, 10 Drawing Sheets

U.S. PATENT DOCUMENTS

| | | | |
|---|---|---|---|
| 7,706,755 B2* | 4/2010 | Muhammad et al. | 455/76 |
| 7,756,480 B2* | 7/2010 | Loh | 455/63.1 |
| 7,856,048 B1* | 12/2010 | Smaini et al. | 375/221 |
| 2002/0072344 A1* | 6/2002 | Souissi | 455/296 |
| 2005/0207509 A1 | 9/2005 | Saunders et al. | |
| 2005/0245216 A1* | 11/2005 | Boos | 455/129 |
| 2006/0240769 A1* | 10/2006 | Proctor, Jr. et al. | 455/24 |
| 2007/0184782 A1 | 8/2007 | Shota et al. | |
| 2007/0184804 A1* | 8/2007 | Robert et al. | 455/296 |
| 2007/0217488 A1 | 9/2007 | Smaini et al. | |
| 2008/0242245 A1* | 10/2008 | Aparin | 455/126 |
| 2009/0017770 A1* | 1/2009 | Mirzaei et al. | 455/73 |
| 2009/0186582 A1* | 7/2009 | Muhammad et al. | 455/63.1 |
| 2009/0232260 A1* | 9/2009 | Hayashi et al. | 375/346 |
| 2010/0048146 A1* | 2/2010 | McCallister | 455/78 |

FOREIGN PATENT DOCUMENTS

| | | |
|---|---|---|
| WO | 01/54290 A2 | 7/2001 |
| WO | 2007/012893 | 2/2007 |
| WO | 2007/024416 | 3/2007 |
| WO | 2007029429 A1 | 3/2007 |
| WO | 2007/149957 A1 | 12/2007 |

OTHER PUBLICATIONS

Aparin, V. et al. "An Integrated LMS Adaptive Filter of TX Leakage for CDMA Receiver Front Ends." IEEE Journal of Solid-State Circuits, vol. 4, No. 5, May 2006.

Safarain, A. et al. "Integrated Blocker Filtering RF Front Ends." 2007 IEEE Radio Frequency Integrated Circuits Symposium, Jun. 3-5, 2007, pp. 13-16.

* cited by examiner

FIG. 10

ACTIVE CANCELLATION OF TRANSMITTER LEAKAGE IN A WIRELESS TRANSCEIVER

TECHNICAL FIELD

The present invention relates generally to frequency-duplex transceivers for use in wireless communication systems, and in particular to methods and apparatus for cancelling transmitter leakage in a wireless transceiver.

BACKGROUND

Many wireless communication systems require full duplex operation, in which a radio transceiver receives and transmits signals simultaneously. Because the transmitter typically outputs signals at a power level much higher than that of received signals, the receiver section of the transceiver often suffers self-interference from the transmitter. This self-interference, sometimes called crosstalk, self-jamming, or transmitter leakage, results from coupling of the transmitted signal to the receiver through any of several mechanisms. For instance, duplexer filters, designed to allow the receiver and transmitter to share an antenna, provide only limited isolation between the transmitter and receiver paths. Larger duplexer devices typically provide more isolation, but market pressures increasingly demand that wireless transceivers be very small. Transmitter leakage may also be coupled from one conductive path in a wireless transceiver to another, even where the two paths are not directly connected, or may result from crosstalk leaking through integrated circuit substrates, device packages, or printed circuit boards.

Transmitter leakage into the receiver path is typically down-converted, along with the received signal of interest. If a receiver comprised perfectly linear components, the down-converted transmitter leakage would often not be a problem, since the transmitter leakage signals would remain separated from the received signal of interest by the frequency duplex spacing, thus permitting effective filtering. However, in practical receivers, utilizing active components having limited linearity, transmitter leakage can result in interference, e.g., degraded signal-to-noise ratio, and thus can interfere with demodulation of the received signal. Transmitter leakage may desensitize a receiver, or, if large enough, even block the receiver from detecting received signals at all.

Recently, direct down-conversion radio receivers have become more widely used. These receivers are typically easy to integrate, thus reducing the total number of components as well as the cost. However, very high linearity in the receiver front-end is typically required. In particular, it can be quite difficult to meet system performance requirements in a direct down-conversion, frequency-duplexing receiver, such as requirements on the second-order intercept point (IIP2) caused by the transmitter leakage and the third-order intercept point (IIP3) caused by the interaction between transmitter leakage and strong interfering signals at half of the duplex distance from the desired signal.

Furthermore, as will be appreciated by those skilled in the art, continuing advances in integrated circuit technology, e.g., advanced CMOS technology, is driving reductions in feature size and corresponding reductions in supply voltages. Reductions in supply voltage result in less voltage headroom, so that device linearity requirements are even harder to meet. Thus, market pressures to reduce transceiver size, cost, and power consumption are presenting continuous challenges for radio receiver design.

Various solutions have been proposed to solve the interference problems caused by transmitter leakage. For instance, several approaches have been proposed that employ least-mean-square (LMS) adaptive filter techniques to cancel the transmitter leakage signal. In some of these approaches, the "error" caused by the transmitter leakage is measured and corrected at baseband (see, for example, U.S. Patent Application Publication 2007/0184782), while in others, the filtering is performed at radio frequencies (RF) (see, for example, U.S. Pat. No. 5,444,864). However, these approaches suffer from several limitations. First, because the residual error is related to the loop gain, larger loop gains result in lower cancellation error. However, large loop gains may cause stability problems. Another problem arises from the DC offset associated with the integrators used in LMS approaches; this problem can be difficult to solve. A third problem relates to convergence, as there may be one or more initial conditions from which the LMS algorithm is unable to achieve a convergent result.

Thus, improved solutions for reducing interference caused by transmit leakage in frequency-duplexing transceivers are needed. In particular, solutions suitable for use in portable, direct down-conversion RF transceivers, such as those used in mobile telephone or other duplex wireless communication systems, are needed.

SUMMARY

Active transmitter leakage cancellation techniques are disclosed, for reducing transmitter leakage in a frequency-duplexing radio transceiver. Reducing transmitter leakage to the receiver path of a duplex transceiver eases the linearity requirements for low-noise amplifier and mixer circuits, potentially reducing transceiver cost as well as complexity.

In one or more embodiments, a leakage-cancelling, frequency-duplexing transceiver includes conventional transmit and receive paths combined with the leakage detection and cancellation circuitry disclosed herein. In some embodiments, the leakage detection circuitry includes an auxiliary sampling mixer, a rectifier, a low-pass filter, and a low-frequency analog-to-digital converter. Exemplary cancellation circuitry includes several digital-to-analog converters, configured to tune a phase and amplitude modulator, and a variable gain/attenuation stage. The cancellation circuitry generates a cancellation signal from the transmitter signal. In many embodiments, the leakage-cancelling transceiver utilizes a base-band processor to regulate the cancellation circuitry to obtain a cancellation signal has the same amplitude as the transmitter leakage signal, but an opposite phase.

In an exemplary method for cancelling transmitter leakage, a radio-frequency (RF) cancellation signal is generated from a transmitter signal, and the RF cancellation signal is combined with a received RF signal to obtain a combined RF signal comprising a residual transmitter leakage component. The residual transmitter leakage component of the combined RF signal is converted, using, e.g., a frequency mixer, to obtain a down-converted signal at baseband or at an intermediate frequency. A magnitude of the residual transmitter leakage component is detected from the down-converted signal, and used to adjust the phase or amplitude of the RF cancellation signal, or both, to reduce the residual transmitter leakage component.

In some embodiments, a reference signal is coupled from the transmitter section of the transceiver, from a point prior to final amplification of the transmitter signal, to form the cancellation signal. In some embodiments, the resulting cancellation signal is injected at the input of a low-noise amplifier circuit, so that the output of the low-noise amplifier circuit comprises the combined RF signal. In other embodiments, the RF cancellation signal is combined with the output of a low-noise amplifier circuit to form the combined RF signal.

In one or more embodiments, adjusting the phase or amplitude of the RF cancellation signal comprises varying the phase of the RF cancellation signal, while holding the amplitude of the RF cancellation signal constant at a first amplitude, to determine an adjusted phase corresponding to a minimum level of the detected magnitude for the first amplitude, and varying the amplitude of the RF cancellation signal, while holding the phase of the RF cancellation signal constant at the adjusted phase, to determine an adjusted amplitude. The resulting adjusted phase and amplitude correspond to a minimum level for the detected magnitude of the residual transmitter leakage.

DETAILED DESCRIPTION

Figure 1:
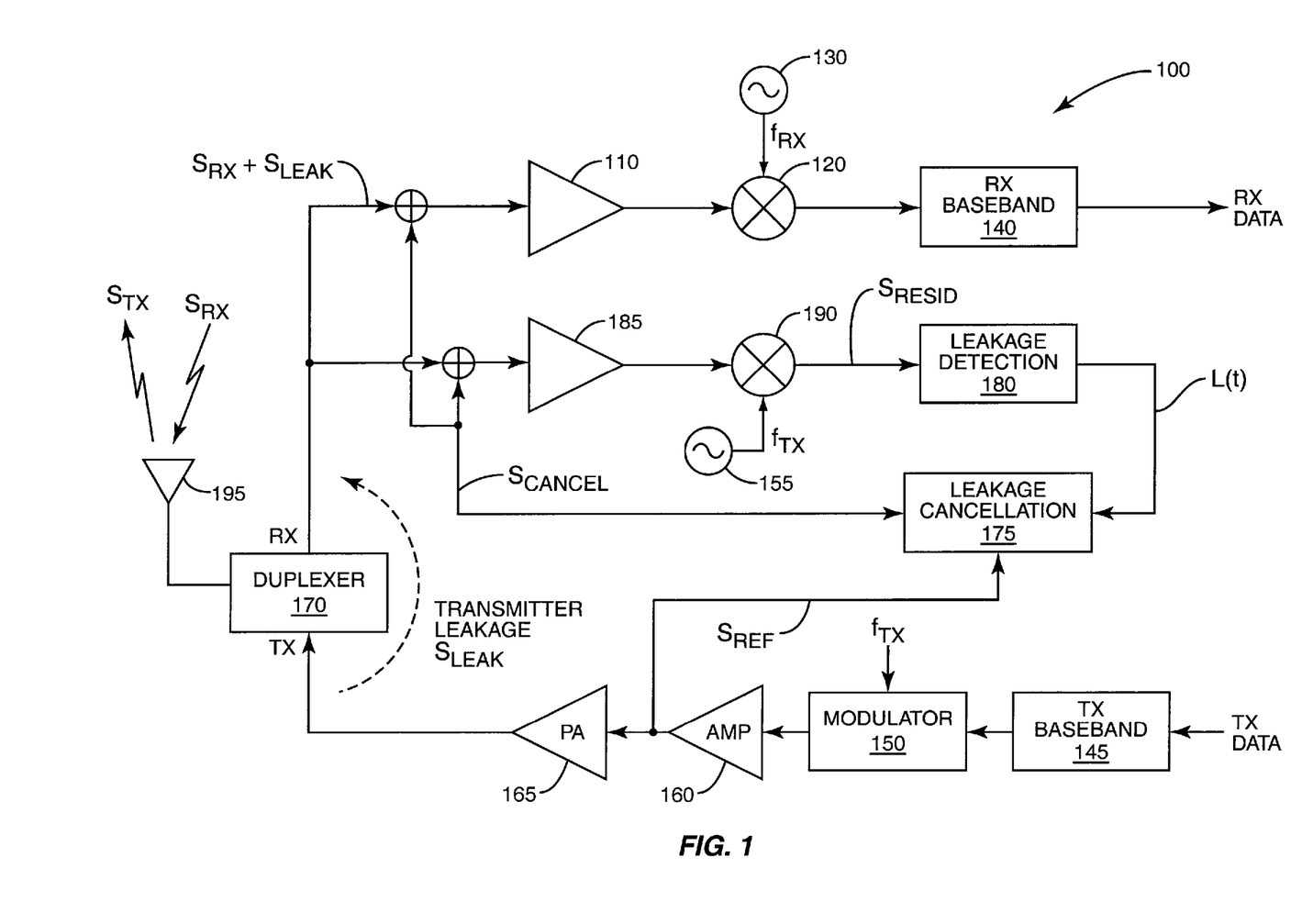
FIG. 1 is a functional block diagram of a frequency-duplexing transceiver according to one or more embodiments of the present invention.

FIG. 1 illustrates the architecture of an exemplary single-band RF transceiver 100, including transmitter leakage cancellation circuitry according to an embodiment of the present invention. In the pictured embodiment, the transceiver includes generally conventional receiver and transmitter paths, plus an additional down-conversion path used to detect the transmitter leakage. The primary receiver path includes a low-noise amplifier (LNA) 110 followed by a mixer stage 120. Mixer stage 120 is driven by RX local oscillator (LO) 130, which produces an LO signal at a frequency of $f_{RX}$. In a direct-conversion receiver, $f_{RX}$ is at or close to the center frequency of the desired received signal $S_{RX}$, to produce a zero-intermediate-frequency (zero-IF) or near-zero-IF baseband signal for further processing.

Those skilled in the art will appreciate that in many embodiments mixer 120 may actually comprise two mixers, driven respectively by an in-phase and quadrature version of the LO signal, to produce in-phase and quadrature baseband signals. In one or more embodiments, RX baseband circuitry 140 includes two low-pass filters (one for each of the in-phase and quadrature baseband signals), as well as two analog-to-digital converters. After conversion to digital signals, the received baseband signals may be detected, demodulated, and decoded according to conventional means. RX baseband circuitry 140 thus includes signal processing circuitry and software, some or all of which may be configured to detect and demodulate received signals formatted according to one or more wireless telecommunications standards, such as the standards developed and promulgated by the 3rd-Generation Partnership Project (3GPP).

Those skilled in the art will appreciate that the receiver architecture pictured in FIG. 1 may be applied to a multi-band RF transceiver as well. Further, the same or similar architecture may be employed in a multi-antenna transceiver as well, with appropriate duplication of some of the illustrated components.

The transmitter path of transceiver 100 includes TX baseband circuitry 145, which converts data to be transmitted into a formatted digital signal for modulator 150. Modulator 150 is driven by a local oscillator signal from TX LO 155, which provides a signal at frequency $f_{TX}$, typically the center frequency of the desired transmitter output signal $S_{TX}$. The output of modulator 150 is amplified at pre-amplifier 160 and power amplifier 165, and coupled to antenna 195 via duplexer 170. In many embodiments, TX baseband circuitry 145 (which may include one or more microprocessors and/or digital signal processors) and modulator 150 are together configured to generate an RF signal for transmission according to one or more wireless telecommunications specifications, such as the 3GPP specifications referenced above. Thus, transmitted signal $S_{TX}$ may comprise, for example, a Code-Division Multiple Access (CDMA) signal, an Orthogonal Frequency Division Multiplex (OFDM) signal, or a Single-Carrier Frequency Division Multiple Access (SC-FDMA) signal, and may be constructed using one or more of a variety of modulation and coding schemes, including, for example, phase shift keying (PSK) or quadrature amplitude modulation (QAM) schemes.

The duplex filter 170 is generally designed to filter out-of-band spurious frequencies and harmonic frequencies from the output of power amplifier 165. In addition, duplex filter provides some level of isolation between the high-power transmit signal (which, in some embodiments, may be at power levels as high as one watt) and the sensitive receiver LNA 110. However, a portion of the transmitted signal will leak through or around duplexer 170, as shown in FIG. 1. This transmitter leakage signal, $S_{LEAK}$, is thus present at the input of LNA 110 along with the desired receive signal $S_{RX}$; as discussed above, the transmitter leakage, left untreated, can seriously impair receiver performance. (Those skilled in the art will appreciate that the transmitter signal may leak into the receiver through various mechanisms. In some cases, a significant leakage signal may first appear at a later point in the receiver path. Nonetheless, transmitter leakage may usually be modeled as though the dominant source does appear at the low-noise amplifier input, and the detrimental effects reduced using the techniques disclosed herein.)

As is well known to those skilled in the art, the detrimental effects of transmitter leakage may be mitigated by injecting a cancellation signal into the receiver path. Ideally, the cancellation signal is constructed so that it has exactly the same shape and amplitude as the interfering transmitter leakage signal. Thus, when injected into the receive path so that the cancellation signal is exactly 180 degrees out of phase with the interfering signal, the transmitter leakage may be perfectly cancelled. Of course, perfect cancellation is typically unattainable, but careful matching of the cancellation signal with the transmitter leakage signal can reduce the effective transmitter leakage by several orders of magnitude.

In FIG. 1, a radio-frequency (RF) cancellation signal $S_{CANCEL}$ is injected into the receive path at the input of low-noise amplifier 110. To the extent that the amplitude of $S_{CANCEL}$ equals or approximates $S_{LEAK}$ but opposite in phase, the downstream effects of the transmitter leakage may be substantially mitigated. Those skilled in the art will appreciate that other techniques for injecting an RF cancellation signal are possible. For instance, as will be discussed in further detail below, an RF cancellation signal may also be injected into the receiver path following the low-noise amplifier.

In the solution pictured in FIG. 1, the RF cancellation signal $S_{CANCEL}$ is generated by leakage cancellation circuit 175, using a reference signal $S_{REF}$ coupled from the transmit path (from the output of pre-amplifier 160, in the embodiment of FIG. 1). As will be described in more detail below, leakage cancellation circuit 175 adjusts the amplitude and phase of the reference signal $S_{REF}$ to obtain an RF cancellation signal $S_{CANCEL}$ that is matched as closely as possible to the transmitter leakage signal $S_{LEAK}$, but opposite in phase.

Leakage cancellation circuitry 175 adjusts the amplitude and phase of the RF cancellation signal $S_{CANCEL}$ in response to a detected magnitude for a residual transmitter leakage component $S_{RESID}$ detected by leakage detection circuitry 180; this residual transmitter leakage component corresponds directly to the portion of the transmitter leakage that remains un-cancelled at any given time. As will be shown below, by successively adjusting the phase and/or amplitude of the cancellation signal $S_{CANCEL}$, the residual transmitter leakage component $S_{RESID}$ can be reduced and maintained at low levels, thus minimizing the effects of transmitter leakage in the receiver path.

To detect the residual transmitter leakage, a secondary receiver path is provided. A second low-noise amplifier 185 is connected to the receiver-side output of duplexer 170, in parallel with RX LNA 110. (In some embodiments, as will be illustrated below, the low-noise amplifier for the primary receiver path may be shared with the secondary receiver path.) Like RX LNA 110, LNA 185 is also supplied with cancellation signal $S_{CANCEL}$ at its input. As a result, assuming that the input characteristics of LNA 110 and LNA 185 are substantially similar, the output of LNA 185 includes a transmitter leakage component that is cancelled to the same degree, relative to the LNA input, as the output of LNA 110.

LNA 185 is followed by mixer stage 190. Unlike the mixer 120 in the receiver path, however, mixer stage 190 is driven by the transmitter local oscillator signal, i.e., at a frequency of $f_{TX}$. As a result, the transmitter leakage component at the output of LNA 185, which is centered at or near $f_{TX}$, is down-converted to a residual transmitter leakage component $S_{RESID}$ at baseband, while received signal components (e.g., corresponding to $S_{RX}$) are separated from the baseband signal $S_{RESID}$ by the duplex frequency separation. The down-converted received signal components are thus easily removed, using a low-pass filter. The remaining residual transmitter leakage component $S_{RESID}$ is then detected, by leakage detection circuitry 180.

Because the transmitter LO is used in the secondary receiver path in FIG. 1, this secondary receiver path (comprising LNA 185, mixer 190, and leakage detection circuitry 180) is essentially a direct-conversion receiver tuned to the transmitter frequency $f_{TX}$. In an alternative embodiment, the primary receiver path may be used, with the addition of a pass-band filter at the output mixer 120, with a pass-band centered at a frequency equal to the duplex spacing, i.e., $|f_{RX} - f_{TX}|$. The filter output may then be detected to determine a magnitude for the residual transmitter leakage. However, the illustrated approach, utilizing a separate down-conversion path for the transmitter leakage detection, will generally provide higher detection sensitivity, since, for example, the output of mixer 120 is likely to exhibit a low-pass filter response characteristic, suppressing the residual transmitter leakage component. Another advantage of the illustrated approach is that it uses a low-pass filter, rather than a band-pass filter, simplifying the circuit implementation.

The primary purpose of the leakage detection circuitry 180 is to detect the magnitude of the residual transmitter leakage, not the modulated transmit signal itself. Thus, instead of immediately filtering the output of mixer 190 with a low-pass filter, a rectifier circuit may first be used. The rectified signal is then low-pass filtered; this filtered signal L(t) is the envelope of the down-converted transmitter leakage. Since the transmitter leakage changes slowly, the bandwidth of L(t) is very low. Thus, the analog signal L(t) may be converted to a digital signal using a low-speed analog-to-digital converter, requiring very little power consumption.

Figure 2:
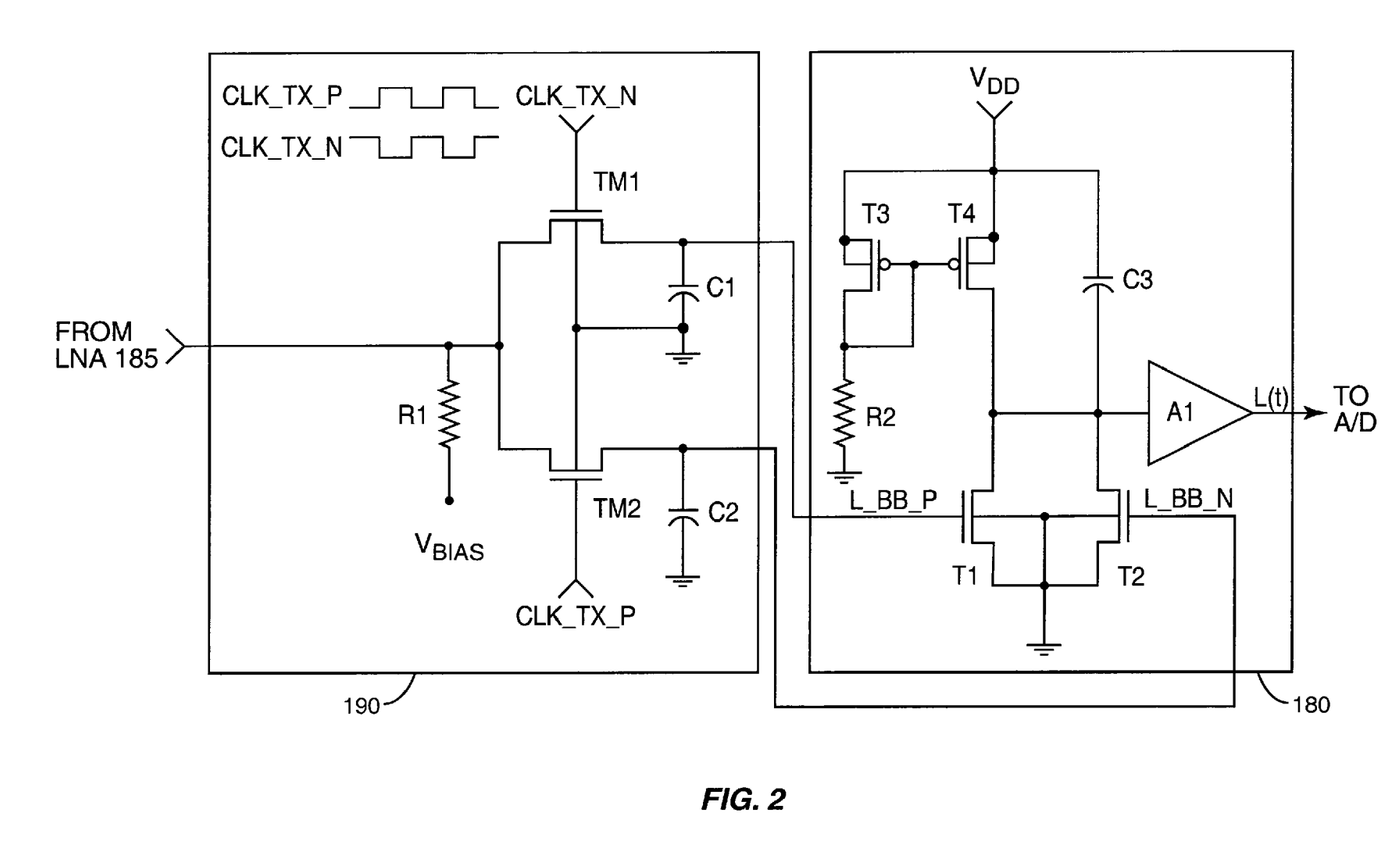
FIG. 2 illustrates exemplary mixer circuitry and leakage detection circuitry.

FIG. 2 illustrates an exemplary frequency mixer 190 and leakage detection circuit 180. In FIG. 2, the input to frequency mixer circuit 190 is connected to the output of the LNA 185 of FIG. 1. A bias voltage $V_{BIAS}$ is provided through resistor R1. Complementary transmitter LO signals CLK_TX_N and CLK_TX_P are used to clock transistors TM1 and TM2, to sample the RF signal. TM1 and TM2 conduct alternately when the clock signals at their respective gates are at high voltage levels, and capacitors C1 and C2 smooth the high frequency ripples from the mixer output at L_BB_P and L_BB_N.

In the exemplary leakage detection circuit 180 pictured in FIG. 2, transistors T1 and T2, biased at close to NFET threshold voltage, form a rectifier circuit that converts the down-converted modulated signal to a very low-frequency envelope representing the leakage amplitude. An amplifier A1 provides gain to scale the detected envelope to an appropriate amplitude for conversion to digital form.

The p-transistor T4 provides an active load for the rectifier. Those skilled in the art will appreciate that in alternate embodiments T4 may be replaced with a passive load, i.e, a resistor. Transistor T3 and resistor R2 create a bias voltage for T4. The active load of T4 and capacitor C3 together form a first order R-C filter, which eliminates the high-frequency harmonics at the rectifier. In some embodiments, a higher-order low-pass filter with a low cut-off frequency may be inserted after the rectifier, since the amplitude of transmitter leakage changes very slowly. However, if too large an R-C time constant is used, the filter delay will increase and influence the regulation speed.

Figure 3:
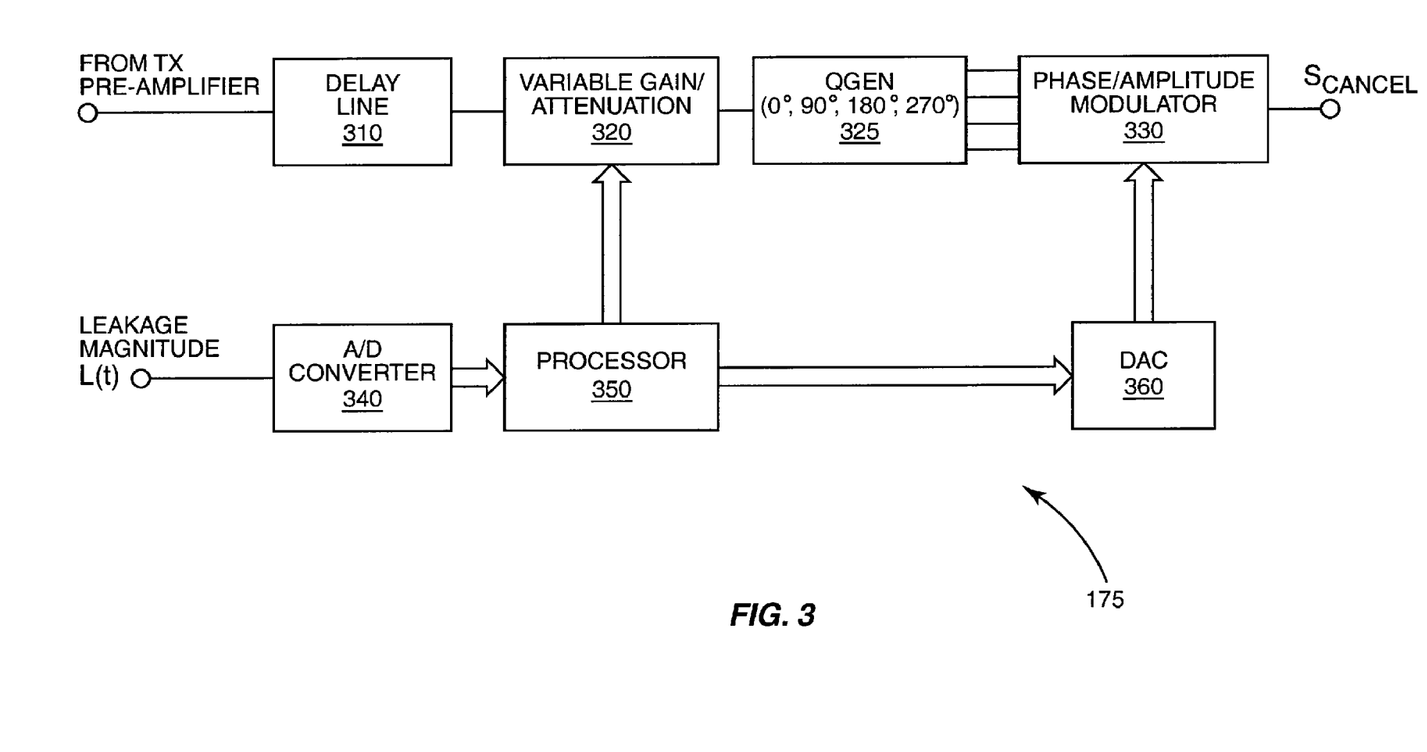
FIG. 3 illustrates leakage cancellation circuitry according to one or more embodiments of the present invention.

Exemplary leakage cancellation circuitry 175 is illustrated in FIG. 3. A reference signal is coupled from the transmitter path of transceiver 100. Those skilled in the art will appreciate that various techniques may be used to couple a portion of the transmitter signal to obtain a reference signal, including various conventional coupler or power divider circuits, or simply a high-impedance tap from the primary transmitter path. Those skilled in the art will also appreciate that the reference signal may be obtained from various points in the transmitter chain. For instance, the reference signal may be obtained from a point in the transmit chain after the power amplifier. However, sampling the transmitter signal prior to final power amplification may be preferred, to avoid introducing additional loss between the power amplifier and the antenna.

In the illustrated cancellation circuitry 175 of FIG. 3, a delay line 310 is inserted between the transmitter chain pre-amplifier 160 and the variable gain/attenuation stage 320. Delay line 310 may be used in some embodiments to match the group delay that the transmitter signal encounters after the reference signal coupling point. Matching the group delay of the duplexer can improve the correlation between the transmitter leakage signal and the cancellation, improving the cancellation circuit's ability to reduce noise.

The reference signal coupled from the transmitter chain passes through a variable gain/attenuation stage 320, a quadrature generator circuit 325, and a phase/amplitude modulator 330 to form the cancellation signal $S_{CANCEL}$. Variable gain/attenuation stage 320, which may be omitted in some embodiments, provides two or more coarse steps of gain and/or attenuation to complement the finer-resolution amplitude control of phase/amplitude modulator 330. Quadrature generator (QGEN) circuit 325, which may comprise one or more RF hybrid circuits, converts the single-ended reference signal at the output of variable gain/attenuation stage 320 into quadrature components—in-phase (I+) and quadrature (Q+) components, as well as their complements (I− and Q−). As will be described in detail later, the quadrature components of the reference transmit signal are inputs to a Gilbert-cell phase modulator circuit in phase/amplitude modulator 330 to produce the phase-modulated and amplitude-adjusted cancellation signal $S_{CANCEL}$.

The transmitter leakage magnitude detected at leakage detection circuit 180 is converted to digital form by analog-to-digital (A/D) converter 340. The detected leakage magnitude is used by processor 350 to control variable gain/attenuation stage 320 and phase/amplitude modulator 330, as will be described in further detail below. Digital-to-analog converters (DACS) 360 convert control signals from processor 350 to analog control signals for phase/amplitude modulator 330. Because the DACs work at very low frequency, their power consumption can be quite small.

One goal of the pictured design is to allow the amplitude of the cancellation signal to be changed over a large range, while keeping the phase constant. As the frequency goes higher, this generally becomes more difficult. If amplitude changes also result in phase changes, tuning the system for minimal transmitter leakage becomes more difficult and more time consuming. This is one reason that the amplitude control of leakage cancellation is split into two parts, i.e., between variable gain/attenuation stage 320 and phase/amplitude modulator 330, in FIG. 3. This design also permits tighter accuracy for the amplitude control.

Figure 4:
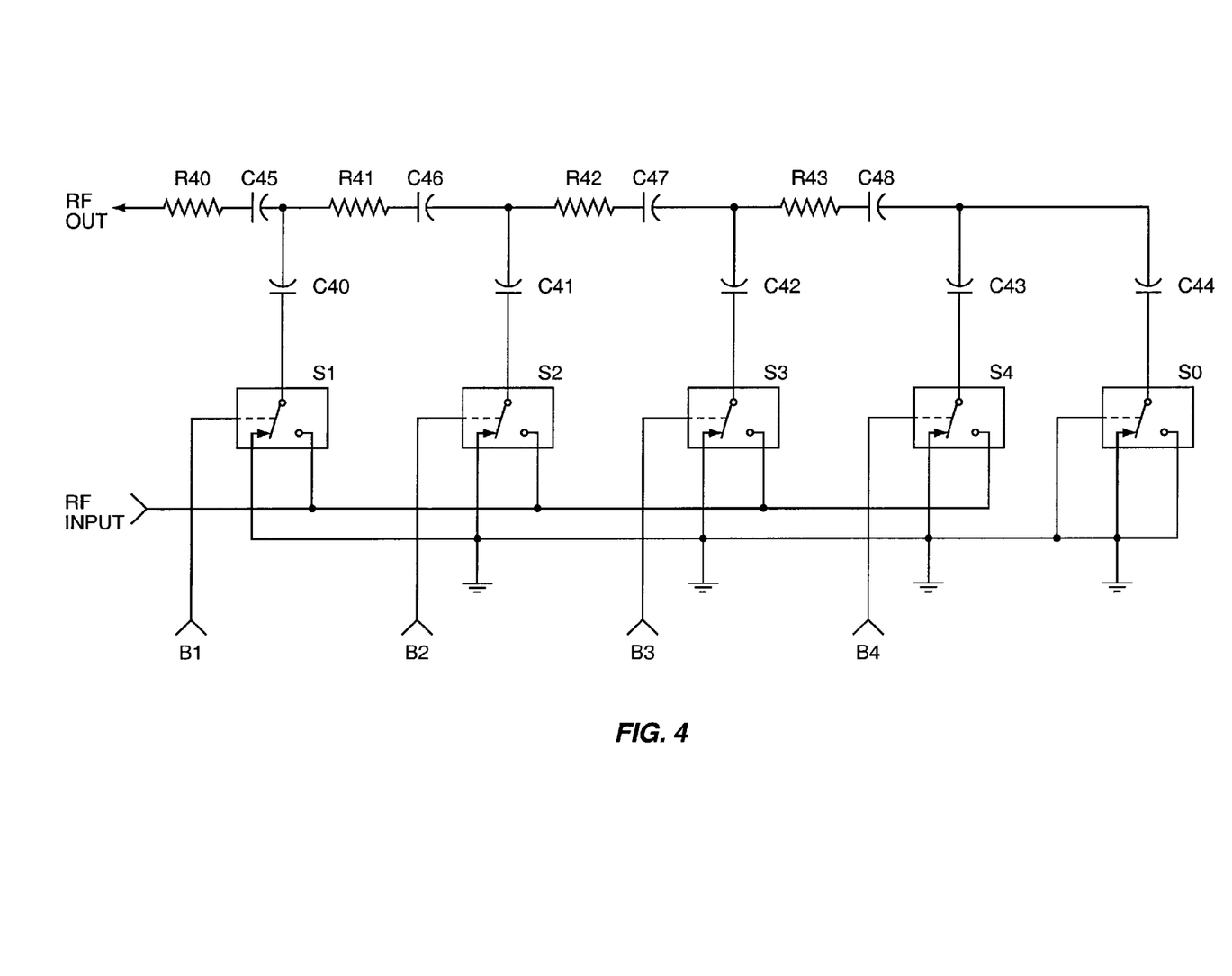
FIG. 4 illustrates a digitally controlled variable attenuator.

A schematic for an exemplary embodiment of variable gain/attenuation stage 320 is provided in FIG. 4. In the pictured embodiment, variable gain/attenuator 320 comprises a 4-bit controlled variable attenuator. The variable attenuator circuit of FIG. 4 comprises several serial impedance bridges and shut impedance branches. The selector switches S1-S4 for each of the shunt impedance branches are controlled by four digital control bits B1, B2, B3 and B4, respectively. When B1 is high, the RF input signal is connected, through switch S1, to the shunt branch comprising C40; otherwise C40 is shunted to ground through S1. The other switches S2-S4 and shunt branches (with capacitors C41-C43) operate similarly. The switch S0 and capacitor C44 are for network matching.

The variable attenuator design of FIG. 4 resembles the well-known R-2R attenuator ladder design used, for example, in digital-to-analog converters. Each switch S1-S4 has a switch resistance of $R_{SWITCH}$. The impedance for each shunt branch should in principle be twice that of the corresponding series branch. For example, the shunt impedance corresponding to the series combination of C40 and $R_{SWITCH}$ should be twice that of the series combination of R40 and C45. The resistors R40-R43 in the series bridges compensate for the phase shift caused by the internal resistance $R_{SWITCH}$ in each active switch. Thus, to maintain phase insensitivity across each tuned amplitude, the resistance for each of resistors R40-R43 should be approximately equal to $R_{SWITCH}/2$, and each of the series capacitors C45-C48 should have a capacitance approximately twice that of the corresponding shunt capacitor C40-C43. With this design, the time constants for the bridge and shunt branches are the same.

Referring once again to FIG. 3, phase/amplitude modulator 330 provides variable phase rotation as well as amplitude control. Among the control signals provided by processor 350 to DACs 360 are one or more bits for amplitude control and several bits for phase control. These digital control bits are converted to analog control signals to control phase/amplitude modulator 330.

Figure 5:
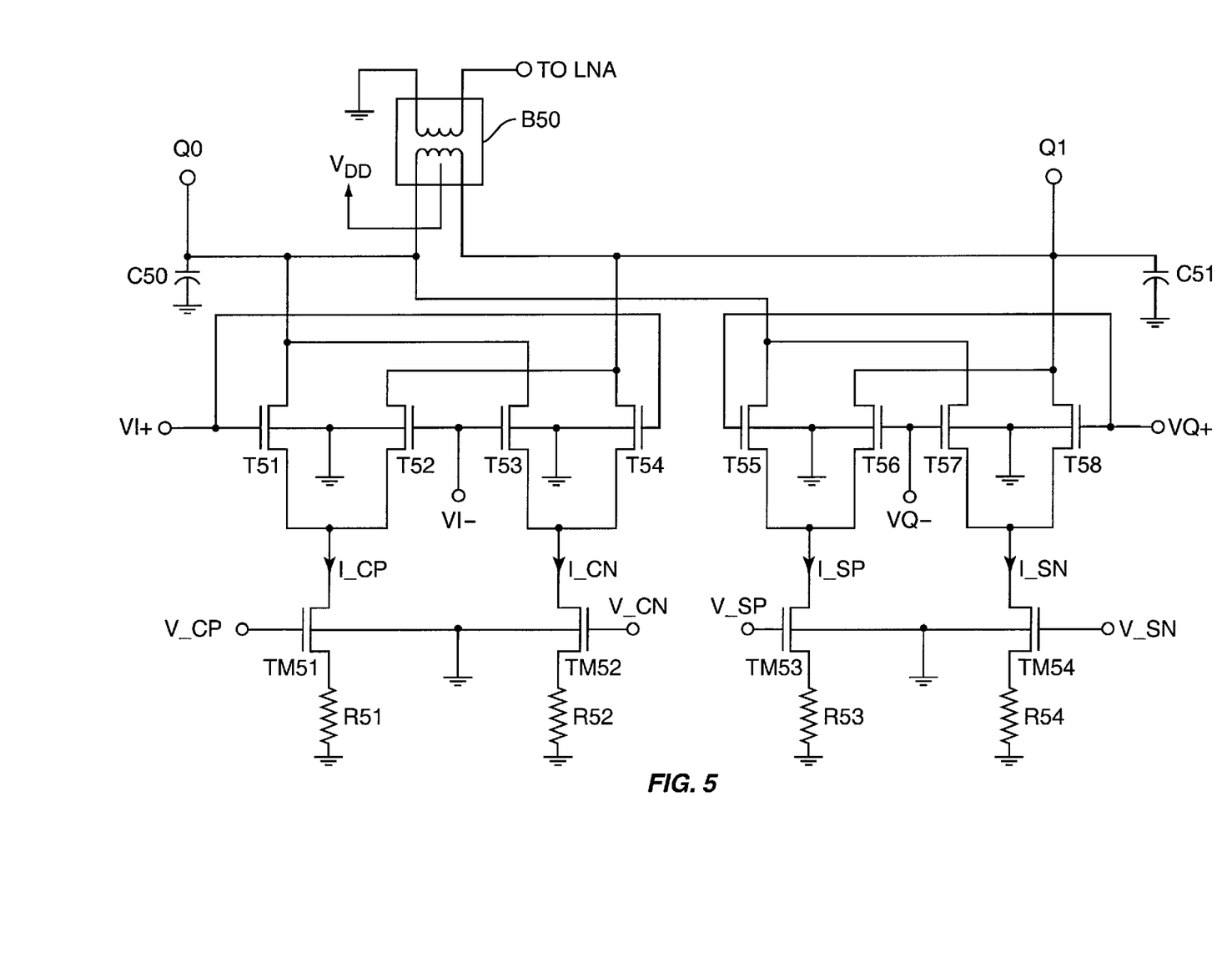
FIG. 5 illustrates a phase/amplitude modulator according to one or more embodiments of the present invention.

An exemplary phase/amplitude modulator 330 is illustrated in more detail in FIG. 5. The pictured design is based on the well-known Gilbert cell, commonly used in mixer design. Transistors TM51-TM54 are biased with control voltages V_CP, V_CN, V_SP, and V_SN, which are created by four DACs 360 (see FIG. 3) from control vectors corresponding to the cosine of the desired phase change plus DC biasing (DC+A cos θ), the sine of the desired phase change plus DC biasing (DC+A sin θ) and their complementary vectors (DC−A cos θ and DC−A sin θ). The scale factor, A, is incorporated into the control voltages to provide amplitude control. The output of the phase/modulator 330 for a transmitter signal input is thus proportional to:

$$C(t)=\sin(\omega_T t)\cdot A\cos(\theta)+\cos\omega_T t\cdot A\sin(\theta)=A\sin(\omega_T t+\theta) \quad (1)$$

where θ is the rotated phase, $\omega_T$ is the angular frequency of the transmitter signal frequency, and A is the gain factor introduced by scaling the control voltages V_CP, V_CN, V_SP, and V_SN. Those skilled in the art will appreciate that if a gain factor B for the variable gain/attenuator 320 is included, then the overall transfer function for a sinusoidal reference signal is:

$$C'(t)=AB\sin(\omega_T t+\theta). \quad (2)$$

Transistors T51-T58 are connected to the outputs of quadrature signal generator 325, in which the reference transmitter signal is converted to the quadrature signals VI+, VI−, VQ+ and VQ−. The Gilbert cell shifts the phase and adjusts the amplitude of the reference transmitter signal, producing the differential output signals Q0 and Q1; the differential output is converted into a single-ended output by balun B50. Another function of the balun B50 is to convert the low impedance output of the Gilbert cell to a high impedance output, so that coupling to the receiver chain has less impact on the receiver performance. Furthermore, since the balun B50 is tuned to the transmitter local oscillator frequency, the balun acts as a band-pass filter and reduces both the transmitter noise contribution to the receiver as well as the amplitude of harmonic frequencies. The harmonics are suppressed by the tuned tank, which include the balun B1, C50 and C51, as shown in FIG. 5.

Resistors R51 to R54 form current feedback, which reduces non-linearity introduced by the transistors. Because the phase/amplitude modulator of FIG. 5 operates only on the relatively narrow-band transmitter signal, it creates harmonics of the transmitter signal but not harmful cross-products falling into the receiver band. Because of this, the linearity of the phase-amplitude modulator circuit is less critical than for other mixers, such as mixer 120. Rather, a monotonic response and high resolution in both phase and amplitude adjustments are more important to providing effective leakage cancellation.

Figure 6:
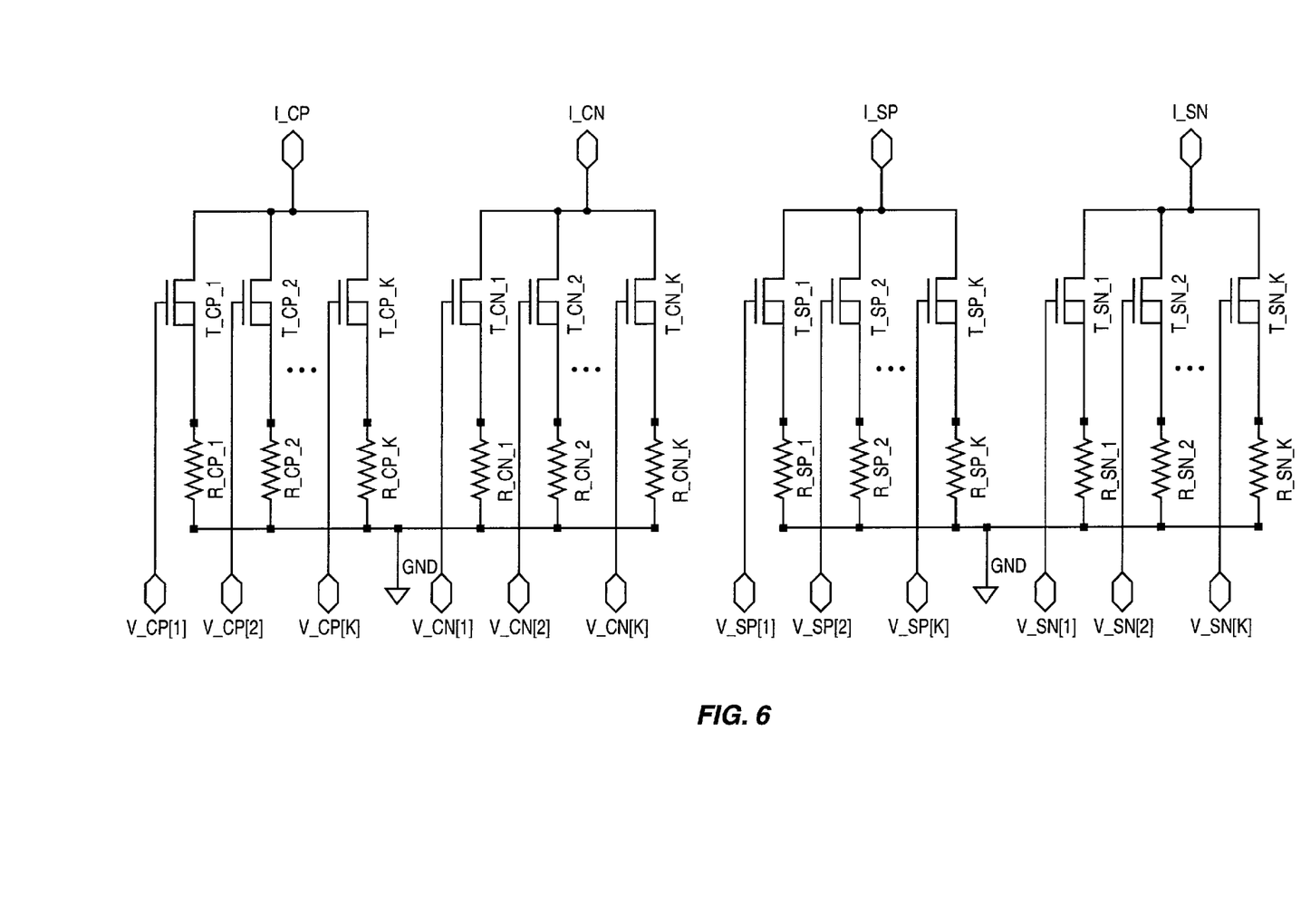
FIG. 6 illustrates exemplary circuitry for generating quadrature control currents for controlling a phase/amplitude modulator according to some embodiments of the present invention.

In a variation of the previously illustrated embodiment, the quadrature current generator portion of the phase amplitude modulator of FIG. 5, as defined by transistors TM51-TM54 and resistors R51-R54, can be merged with the DACs 360. This is illustrated in FIG. 6, where T_CP_1 to T_CP_k, T_CN_1 to T_CN_k, T_SP_1 to T_SP_k, and T_SN_1 to T_SN_k are four sets of k binary-weighted transistors, and R_CP_1 to R_CP_k, R_CN_1 to R_CN_k, R_SP_1 to R_SP_k, and R_SN_1 to R_SN_k are four corresponding sets of k binary-weighted resistors. The pictured circuit provides four DACs, converting k-dimensional digital control words V_CP[k], V_CN[k], V_SP[k], and VS_N[k] into proportional currents I_CP, I_CN, I_SP, and I_SN.

The cancellation signal $S_{CANCEL}$ produced by leakage cancellation circuit 175 may be coupled, typically through a DC-blocking capacitor, either before or after low-noise amplification in the receiver path. The transceiver architecture of FIG. 1 illustrates an exemplary embodiment of the present invention employing an input-injected cancellation signal. Those skilled in the art will appreciate that the present invention may be applied to multi-band transceivers, whether input- or output-injection is used.

Figure 7:
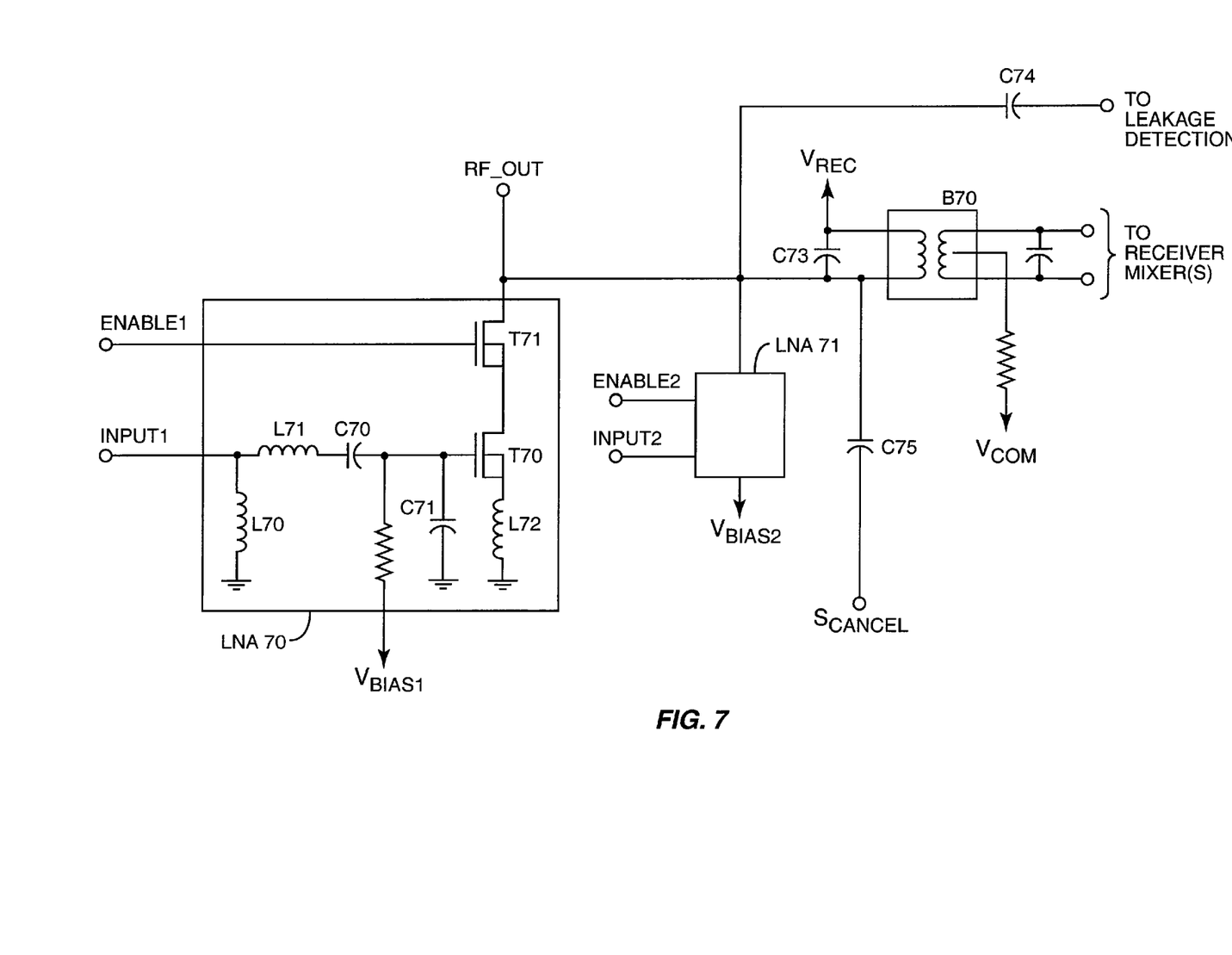
FIG. 7 illustrates output-injection of a cancellation signal according to some embodiments of the invention.

For example, FIG. 7 illustrates the injection of a transmitter leakage cancellation signal at the output of low-noise amplifiers in a multi-band receiver. In such an embodiment, duplication of the low-noise amplifier for the leakage detection path is not required.

In the multi-band embodiment of FIG. 7, two low-noise amplifiers are shown. LNA70 includes two cascade transistors T70 and T71 in a common source and common gate configuration, and an input matching network including inductors L70 and L71, coupling capacitor C70 and parasitic input capacitor C71, and a source degeneration inductor L72. LNA70 and LNA71 share one output load-a resonant tank that includes balun/transformer B70, capacitor C73 and transistor parasitic capacitance from LNA70 or LNA71. The multi-band LNAs' output node RF_OUT is divided into two output paths. One is connected to leakage detection circuitry through capacitor C74, and another is coupled by the balun B70 to one or more mixers in the primary receiver path, e.g., to in-phase and quadrature mixers.

A leakage cancellation signal $S_{CANCEL}$ is injected at the output node of LNA70 and LNA71 through coupling capacitor C75. Since all of the low-noise amplifiers share an output node, a single cancellation signal is valid for all bands.

An advantage of injecting the cancellation signal at the output of one or more low-noise amplifiers, as pictured in FIG. 7, is that the received signal is amplified by the low-noise amplifier stage prior to the injection. As a result, the injection of the cancellation signal has little effect on the system noise figure. On the other hand, injection of the cancellation signal at the output of the low-noise amplifier stage requires a larger cancellation signal level, compared to input injection, to fully cancel the transmitter leakage signal.

Figure 8:
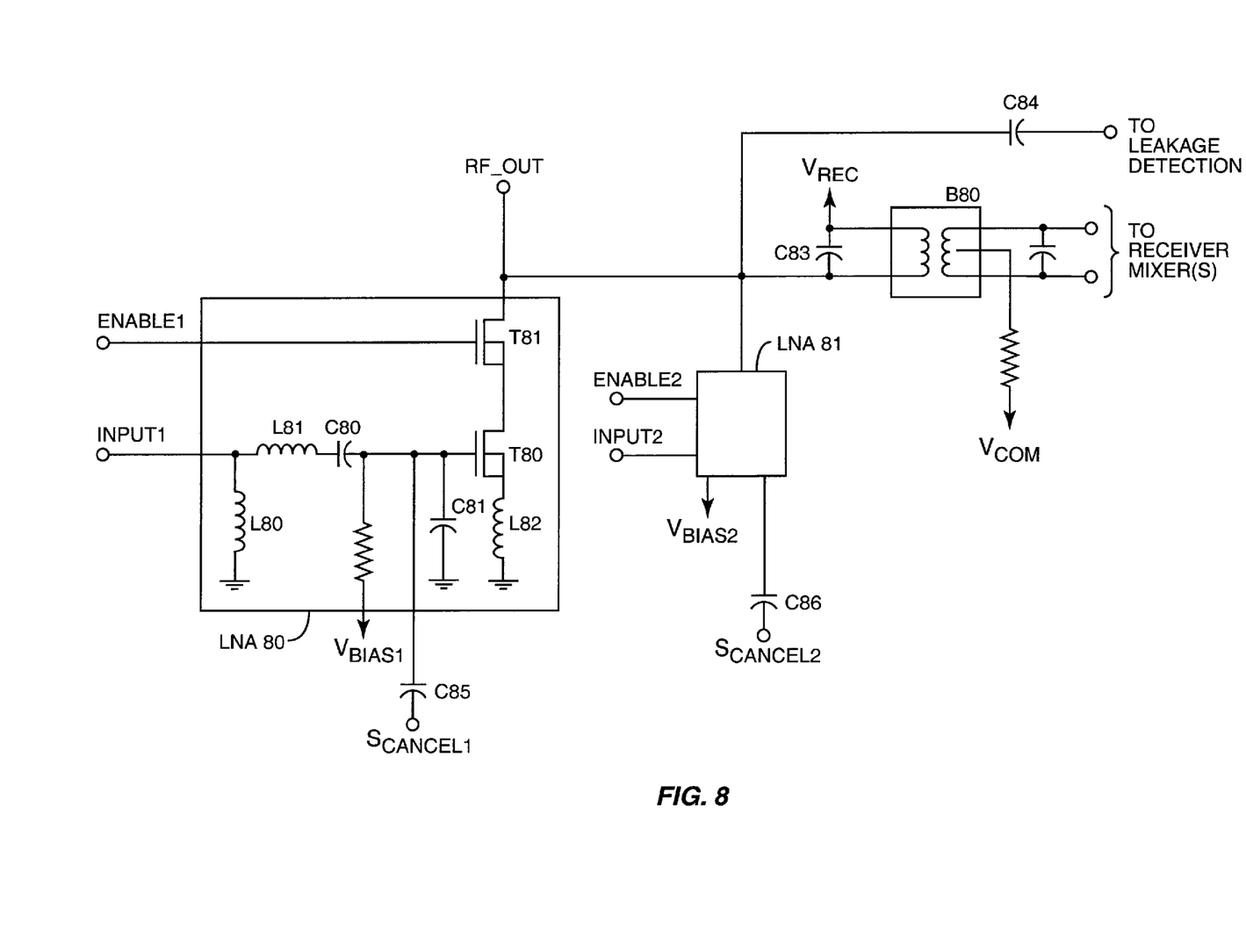
FIG. 8 illustrates input-injection of a cancellation signal according to some embodiments of the invention.

An illustration of input injection in a multi-band receiver is provided in FIG. 8. Again, two low-noise amplifiers, LNA80 and LNA81, are illustrated. LNA80 is illustrated in detail, where transistors T80 and T81, capacitors C80 and C81, and inductors L80-L82, have the same functions as their counterparts in FIG. 7. As with FIG. 7, the low-noise amplifiers share an output node in the circuit of FIG. 8. This common output is coupled to a conversion stage in the primary receiver path via balun B80, and to the leakage detection circuitry via capacitor C84.

Unlike the configuration of FIG. 7, the circuit of FIG. 8 includes separate input nodes for the leakage cancellation signal, pictured here as $S_{CANCEL\_1}$ and $S_{CANCEL\_2}$. A first cancellation signal input is coupled to the input of LNA80 via C85. A second cancellation signal input is connected to LNA81 via C86; the details of this configuration are not shown.

Differences between output and input injection will be readily understood by those skilled in the art. For instance, if the injection is performed at a node in front of the first active device in the receive path, then the injection operation is purely linear. As a result, there is no harmonic distortion of the transmitter leakage component, which is unavoidable in output injection. Furthermore, as mentioned above, an input-injected cancellation signal level is lower than that of an output-injected signal by a factor equal to the power gain of the low-noise amplifier.

A few drawbacks of the input injection method are also apparent. In an input-injected embodiment, each LNA input of a multi-band receiver must be separately connected to the cancellation signal. Furthermore, under some circumstances, the cancellation signal may cause degradation of the system noise figure, since the injected cancellation signal path may not precisely match the group delay through the leakage path, e.g., the leakage path through the duplex filter. In such a case, even though the amplitude and phase of the cancellation signal may be well matched to the leakage signal, the noise correlation between transmitter leakage and cancellation signals may be poor at frequencies very close to the frequency of desired RF received signals. This noise spectrum near to the receiver band will be down-converted into the base-band and degrade the received signal, unless the paths have exactly the same group delay.

The additional noise created by cancellation can generally be reduced by increasing the cancellation signal level and reducing the input coupling capacitor (e.g., C75 or C85). In addition, a higher quality factor (Q) for the tank used in the phase/amplitude modulator circuit can also effectively filter away receive-band noise from the cancellation signal.

Using the techniques described above, various embodiments of a leakage-cancelling frequency-duplexing transceiver may be constructed. In many of these embodiments, the phase and amplitude of the leakage cancellation signal may be independently adjusted, so that the phase of the cancellation signal may be adjusted without significantly influencing the amplitude, and vice versa. This characteristic simplifies the tuning procedure for minimizing the residual leakage, as a best setting for each of the two dimensions (phase and amplitude) of the adjustment procedure may be separately and independently determined.

Figure 9:
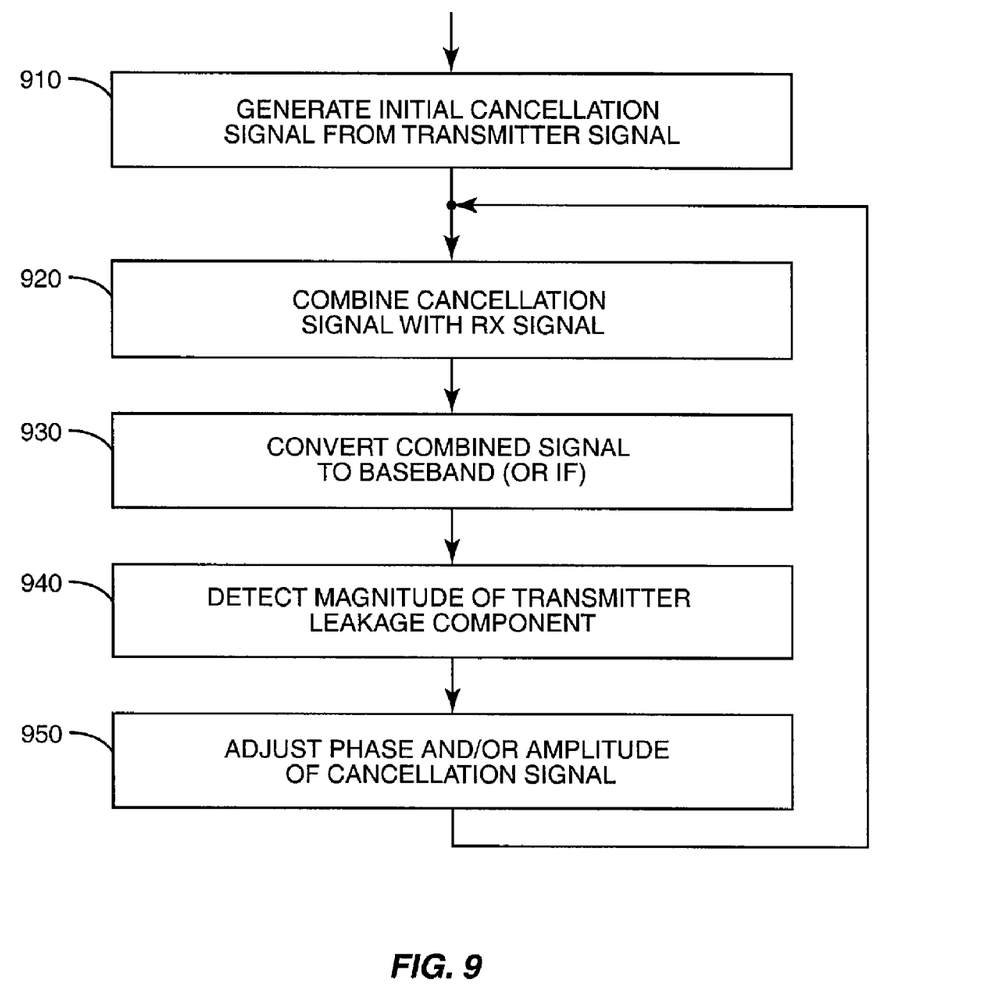
FIG. 9 is a flow diagram illustrating an exemplary tuning procedure according to one or more embodiments of the invention.

An overview of an exemplary tuning procedure is illustrated in the flow diagram of FIG. 9.

The procedure begins, at block 910, with the generation of an initial cancellation signal from the transmitter signal. As discussed above, a reference signal may be coupled from the transmitter path of the transceiver using any of several methods. At block 910, the phase and amplitude adjustments of the leakage cancellation circuit are set to an arbitrary starting point. In one or more embodiments, the cancellation signal is set to a relatively low level, perhaps 10 dB below the expected, or "normal" transmitter leakage level. Preferably, this initial level is set at or near the lowest level at which amplitude adjustments cause the detected magnitude of the residual leakage to fluctuate.

The initial cancellation signal is combined with the received signal at block 920. As described above, the cancellation signal may be "injected" at any of several points in the receiver path, such as at a low-noise amplifier input or output. At block 930, the combined signal is converted to baseband, where a magnitude of the transmitter leakage component of the down-converted signal is detected, at block 940. As discussed above, in some embodiments of the present invention, the transmitter leakage is converted to baseband using a secondary receive path, including a mixer driven by a local oscillator tuned to the transmitter frequency. In other embodiments, the down-conversion of block 930 may be to an intermediate frequency (IF), and the detection of the transmitter leakage component of block 940 performed at the IF. In the latter embodiment, the down-conversion stage of the primary receiver path may be shared. If this stage is driven by a local oscillator tuned to the received signal frequency, then the desired received signal will be converted to baseband, while the residual (un-cancelled) transmitter leakage component is translated to an IF at a frequency equal to the duplex spacing.

In any event, after the magnitude of the transmitter leakage component is detected, as shown at block 940, the phase and/or amplitude of the cancellation signal is adjusted, as illustrated at block 950. The detected magnitude of the transmitter leakage component may be monitored after each adjustment of the phase and/or amplitude, so that the magnitude can be reduced to its lowest possible level. As those skilled in the art will appreciate, a low magnitude for the detected leakage component in the leakage detection circuit corresponds directly to good cancellation of the transmitter leakage in the primary receive path. As those skilled in the art will further appreciate, by regularly monitoring the detected magnitude for the leakage, and adjusting the phase and/or amplitude of the cancellation signal as needed, changes in the transmitter leakage, as might occur due to temperature, transmitter power, antenna loading, etc., can be monitored. As changes in the transmitter leakage are relatively slow, the adjustment loop of FIG. 9 can be a correspondingly slow loop. This characteristic allows the circuit designer to employ low-speed electronics that consume very low power.

Figure 10:
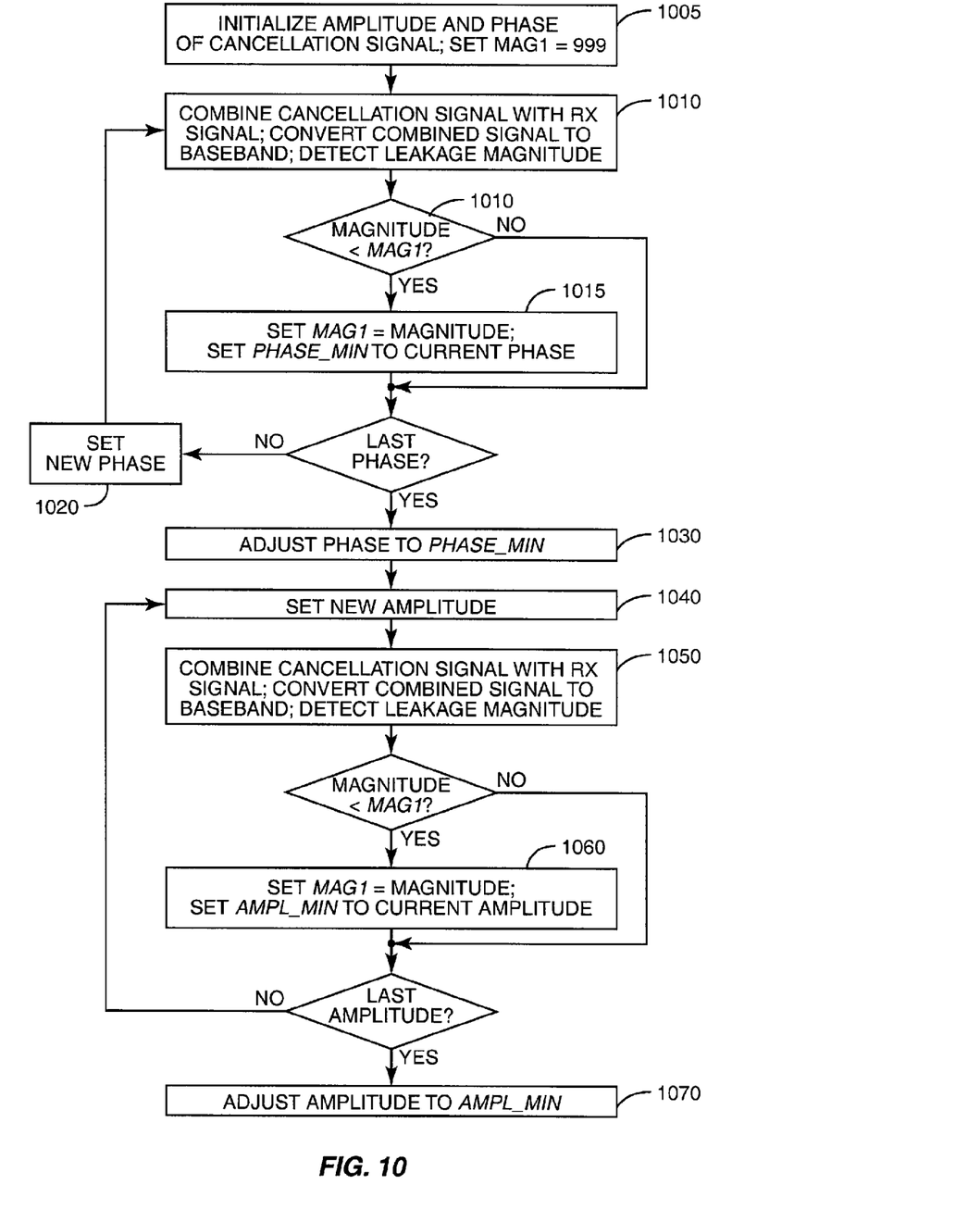
FIG. 10 is a flow diagram illustrating another exemplary tuning procedure.

In FIG. 10, a more detailed view of an exemplary tuning procedure is illustrated. This procedure will be explained in the context of the circuitry pictured in FIG. 1, although those skilled in the art will appreciate that the described procedure may be applied to various transceiver and circuit configurations. In the pictured procedure, an optimal phase adjustment is first determined, and then an optimal amplitude adjustment. However, those skilled in the art will appreciate that this order may be reversed, i.e., the optimal amplitude may be determined first, and then the optimal phase.

At block 1005, the amplitude and phase of the cancellation are set to an initial level, using gain/attenuation stage 320 and phase/amplitude modulator 330. As discussed above, the amplitude is preferably set to a relatively low level, but at a level high enough so that changes in the amplitude, or phase, or both, affect the output of the leakage detection circuitry. The phase can generally be set to an arbitrary starting phase. In addition, a variable used to keep track of the "best" (i.e., lowest) leakage magnitude is initialized. In the illustration of FIG. 1005, this variable, MAG1, is set to an initial value of 999; an appropriate initialization value for this variable depends on the circuit implementation.

At block 1010, the cancellation signal is combined with the received signal, the combined signal is converted to baseband (or IF), and a magnitude for the transmitter leakage component is detected, as was described in detail above. If the detected magnitude is better than the previous "best" magnitude, then a second variable, PHASE_MIN, is set to hold the current phase, and the variable MAG1 is updated with the new best magnitude level, as shown at block 1015. If, on the other hand, the magnitude at the current amplitude and phase are not better than the previously recorded best level, then neither the PHASE_MIN or MAG1 variable are updated.

At block 1020, the phase of the phase/amplitude modulator is adjusted, using phase/amplitude modulator 330, to a new setting, and the steps of blocks 1010 and 1015 are repeated. In some embodiments, each possible setting for the phase is tested, to determine the phase (for the initial amplitude that yields the lowest detected leakage magnitude). Thus, when all possible set of phases have been tested, the phase is adjusted to PHASE_MIN, which corresponds to the phase yielding the lowest leakage, as shown at block 1030.

Next, an optimal amplitude setting is determined, while holding the phase constant (at PHASE_MIN). The cancellation signal is adjusted to a new amplitude at block 1040. In some embodiments, the amplitude is adjusted by the smallest possible increment; in others, coarse steps may be used initially, followed by steps of finer resolution. In the transceiver of FIG. 1, coarse steps may be implemented using the gain/attenuation stage 320, while fine-resolution steps are implemented with the phase/amplitude modulator 330.

At block 1050, the amplitude-adjusted cancellation signal is combined with the received signal, the combined signal is converted to baseband, and the magnitude of the resulting residual leakage component is detected. If the detected magnitude is better (i.e., lower) than seen before, then the tracked leakage magnitude MAG1 is set to the new value, and the current amplitude setting stored in AMPL_MIN, at block 1060. If not, neither variable is adjusted before testing a new amplitude level.

The blocks 1040, 1050, and 1060 are repeated until all possible set of amplitudes has been tested (or, in some embodiments, until it is determined that no further improvements in the cancellation are possible), at which point the amplitude is adjusted to AMPL_MIN, which corresponds to the amplitude yielding the best cancellation (for the phase setting of PHASE_MIN). As discussed above, if the phase and amplitude adjustments are independent, the combination of AMPL_MIN and PHASE_MIN will correspond to a minimum value for the detected magnitude of the residual transmitter leakage. If the phase and amplitude adjustments are slightly interdependent, then the procedures of FIG. 10 may be repeated, beginning with the phase and amplitude settings determined from the first cycle, to further improve the cancellation.

Accordingly, those skilled in the art will recognize that the procedure in FIG. 10 may be repeated one or more times, or continuously, to improve the accuracy of the cancellation or to track changes in the transmitter leakage, or both. Furthermore, in some such embodiments, the resolution of the tuning of the phase and/or the amplitude may be adjusted from one cycle to the next. For example, at initialization, large adjustment steps may be used to search for a minimum; well-known binary search or "golden cut" methods may be used to locate a minimum. Once a minimum has been detected, the search steps may be reduced, to find a convergence point corresponding to the maximum achievable cancellation. Therefore, multiple adaptive optimization algorithms may be used, in some embodiments of the present invention.

Embodiments of the present invention thus provide methods for cancelling transmitter leakage in a frequency-duplexing transceiver. The disclosed techniques are applicable to multi-band transceivers, as well as transceivers employing diversity antenna and/or multiple-input multiple-output (MIMO) techniques. Those skilled in the art will appreciate that the particular design of a frequency-duplexing transceiver in accordance with the inventive techniques, and the associated nomenclature used in connection with such a receiver, may vary according to the network standard involved, but such variations are not germane to understanding or explaining the present invention. Moreover, it should be understood that the radio devices and circuitry illustrated and discussed herein are simplified; actual implementations likely will have additional entities that have been omitted, for clarity, from the discussion herein.

Nevertheless, an exemplary frequency-duplexing transceiver 100 may include one or more of the exemplary circuits illustrated in FIGS. 1-8. Some of these receiver circuits may be implemented using various processing circuits, including A/D converters, filters, DSPs or other digital processors, memory, and the like. In at least one exemplary embodiment, transceiver 100 includes processing circuits, such as the processor 350 of FIG. 3, that includes one or more DSPs and/or Application Specific Integrated Circuits (ASICS) or other programmable devices. These processing circuits may be configured to include processing logic to carry out one or more of the methods described herein and/or illustrated in FIGS. 9 and 10. It should thus be understood that at least a portion of the present invention's functionality may be embodied as stored computer instructions in the form of micro-code, firmware, software, etc.

More generally, the present invention can be implemented in hardware, software, or essentially any combination thereof, according to the needs of a particular design. Although the present invention has been described herein with respect to particular features, aspects and embodiments thereof, it will be apparent that numerous variations, modifications, and other embodiments are possible within the broad scope of the present invention, and accordingly, all variations, modifications and embodiments are to be regarded as being within the scope of the invention. The present embodiments are therefore to be construed in all aspects as illustrative and not restrictive and all changes coming within the meaning and equivalency range of the appended claims are intended to be embraced therein.

What is claimed is:

1. A method of cancelling transmitter leakage in a primary receiver path of a frequency-duplexing transceiver, comprising:
   generating a radio-frequency (RF) cancellation signal from a transmitter signal;
   combining the RF cancellation signal with a received RF signal to obtain a combined RF signal comprising a residual transmitter leakage component;
   converting, in a secondary receiver path, the residual transmitter leakage component of the combined RF signal to a down-converted signal by mixing, in the secondary path, the combined RF signal with a local oscillator signal at a first frequency where the transmitter signal is centered;
   detecting, in the secondary receiver path, a magnitude of the residual transmitter leakage component from the down-converted signal;
   obtaining a phase or amplitude adjustment, or both, based on the detected magnitude; and
   applying the phase or amplitude adjustment, or both, to the RF cancellation signal to reduce the residual transmitter leakage component.

2. The method of claim 1, wherein generating an RF cancellation signal from a transmitter signal comprises coupling the transmitter signal from a transmitter section of the transceiver, from a point prior to final amplification of the transmitter signal.

3. The method of claim 1, wherein combining the RF cancellation signal with a received RF signal comprises injecting the RF cancellation signal at the input of a low-noise amplifier circuit, so that the output of the low-noise amplifier circuit comprises the combined RF signal.

4. The method of claim 1, wherein combining the RF cancellation signal with a received RF signal comprises combining the RF cancellation signal with the output of a low-noise amplifier circuit configured to amplify the received RF signal, prior to said converting.

5. The method of claim 1, wherein detecting the magnitude of the residual transmitter leakage component from the down-converted signal comprises rectifying the down-converted signal and filtering the rectified down-converted signal with a low-pass filter.

6. The method of claim 1, wherein the received RF signal is centered at a second frequency, and wherein converting the residual transmitter leakage component of the combined RF signal to a down-converted signal comprises mixing the combined RF signal with a local oscillator signal at the second frequency to convert the residual transmitter leakage component to the intermediate frequency.

7. The method of claim 6, further comprising filtering the residual transmitter leakage component at the intermediate frequency prior to detecting the magnitude of the residual transmitter leakage component.

8. The method of claim 1, wherein obtaining the phase or amplitude adjustment, or both, based on the detected magnitude, and applying the phase or amplitude adjustment, or both, to the RF cancellation signal to reduce the residual transmitter leakage component, comprises:
   while holding the amplitude of the RF cancellation signal constant at a first amplitude, varying the phase of the RF cancellation signal to determine an adjusted phase corresponding to a minimum level of the detected magnitude for the first amplitude; and
   while holding the phase of the RF cancellation signal constant at the adjusted phase, varying the amplitude of the RF cancellation signal to determine an adjusted amplitude corresponding to a minimum level of the detected magnitude for the adjusted phase.

9. The method of claim 1, wherein obtaining the phase or amplitude-adjustment, or both, based on the detected magnitude, and applying the phase or amplitude adjustment, or both, to the RF cancellation signal to reduce the residual transmitter leakage component, comprises:
   while holding the phase of the RF cancellation signal constant at a first phase, varying the amplitude of the RF cancellation signal to determine an adjusted amplitude corresponding to a minimum level of the detected magnitude for the first phase; and
   while holding the amplitude of the RF cancellation signal constant at the adjusted amplitude, varying the phase of the RF cancellation signal to determine an adjusted phase corresponding to a minimum level of the detected magnitude for the adjusted amplitude.

10. A frequency-duplexing transceiver comprising:
   a transmitter section configured to produce a transmitter signal at a first frequency;
   a front-end section configured to combine a received radio-frequency (RF) signal with an RF cancellation signal to obtain a combined RF signal comprising a residual transmitter leakage component resulting from leakage to the front-end section from the transmitter section;
   a frequency mixer coupled to the front-end section and configured to convert, in a secondary receiver path, the residual transmitter leakage component of the combined RF signal to a down-converted signal by mixing, in the secondary receiver path, the combined RF signal with a local oscillator signal at the first frequency;

a leakage detector section coupled to the frequency mixer and configured to detect, in the secondary receiver path, a magnitude of the residual transmitter leakage component from the down-converted signal; and a leakage cancellation section coupled to the leakage detector section, the transmitter section, and the front-end section, and configured to couple the transmitter signal from the transmitter to generate the RF cancellation signal, and to obtain a phase or amplitude adjustment, or both, based on the detected magnitude, and to apply the phase or amplitude adjustment, or both, to the RF cancellation signal, to reduce the residual transmitter leakage component in a primary receiver path.

11. The frequency-duplexing transceiver of claim 10, wherein the leakage cancellation section couples the transmitter signal from the transmitter section at a point prior to final amplification of the transmitter signal.

12. The frequency-duplexing transceiver of claim 10, wherein the front-end section comprises a low-noise amplifier circuit configured to amplify the received RF signal, and wherein the RF cancellation signal is injected at the input of the low-noise amplifier circuit so that the output of the low-noise amplifier circuit comprises the combined RF signal.

13. The frequency-duplexing transceiver of claim 10, wherein the front-end section comprises a low-noise amplifier circuit configured to amplify the received RF signal, and wherein the RF cancellation signal is combined with the output of the low-noise amplifier circuit to obtain the combined RF signal.

14. The frequency-duplexing transceiver of claim 10, wherein the leakage detector section comprises a rectifier configured to detect the envelope of the residual transmitter leakage component, a low-pass filter configured to filter the detected envelope, and a analog-to-digital converter configured to sample the filter output to obtain the magnitude of the residual leakage component.

15. The frequency-duplexing transceiver of claim 10, wherein the received RF signal is centered at a second frequency, and wherein the frequency mixer comprises a mixer circuit configured to mix the combined RF signal with a local oscillator signal at the second frequency to convert the residual transmitter leakage component to the down-converted signal at the intermediate frequency.

16. The frequency-duplexing transceiver of claim 15, wherein the frequency mixer further comprises an intermediate frequency filter configured to filter the output of the mixer circuit to obtain the down-converted signal.

17. The frequency-duplexing transceiver of claim 10, wherein the leakage cancellation section comprises a phase and amplitude modulator circuit for independently adjusting the phase and amplitude of the RF cancellation signal and processing circuitry for controlling the phase and amplitude modulator circuit based on the detected magnitude of the residual transmitter leakage component.

18. The frequency-duplexing transceiver of claim 17, wherein the leakage cancellation section further comprises a variable attenuator configured to provide two or more levels of attenuation of the RF cancellation signal under the control of the processing circuit.

* * * * *